United States Patent
Pottenger (12)

(10) Patent No.: US 6,198,204 B1
(45) Date of Patent: Mar. 6, 2001

(54) PIEZOELECTRICALLY CONTROLLED ACTIVE WEAR

(76) Inventor: Michael D. Pottenger, 2608 Third St., Apartment A, Santa Monica, CA (US) 90405

(*) Notice: Subject to any disclaimer, the term of this patent is extended or adjusted under 35 U.S.C. 154(b) by 0 days.

(21) Appl. No.: 09/491,670

(22) Filed: Jan. 27, 2000

(51) Int. Cl.$^7$ .................................................. H01L 41/04
(52) U.S. Cl. ............................................ 310/326; 310/316
(58) Field of Search .................................. 310/800, 316, 310/321, 326

(56) References Cited

U.S. PATENT DOCUMENTS

| | | | |
|---|---|---|---|
| 3,493,986 | * 2/1970 | Erwin | 12/142 R |
| 3,818,756 | * 6/1974 | Barron et al. | 73/172 |
| 4,191,192 | 3/1980 | McDavid | 450/33 |
| 4,289,137 | 9/1981 | Dell et al. | 450/58 |
| 4,583,544 | 4/1986 | Flanagan et al. | 450/58 |
| 4,748,366 | 5/1988 | Taylor | 310/328 |
| 4,816,005 | 3/1989 | Braaten | 450/50 |
| 4,948,951 | * 8/1990 | Balzano | 219/528 |
| 5,050,595 | 9/1991 | Krafft | 450/38 |
| 5,244,432 | 9/1993 | Moy Au et al. | 450/54 |
| 5,353,793 | 10/1994 | Bornn | 600/386 |
| 5,471,405 | * 11/1995 | Marsh | 702/41 |
| 5,500,635 | 3/1996 | Mott | 340/323 R |
| 5,565,124 | * 10/1996 | Balzano | 219/543 |
| 5,621,922 | 4/1997 | Rush, III | 2/422 |
| 5,690,537 | 11/1997 | Kalmus | 450/57 |
| 5,694,645 | * 12/1997 | Triplette | 2/102 |
| 5,775,715 | 7/1998 | Vandergrift | 280/602 |
| 5,802,607 | * 9/1998 | Triplette | 2/1 |

\* cited by examiner

*Primary Examiner*—Nestor Ramirez
*Assistant Examiner*—Peter Medley
(74) *Attorney, Agent, or Firm*—Jones, Day, Reavis & Pogue

(57) ABSTRACT

An article of clothing including a piezoelectric transducer and an electrical component restrains movement of a first body portion relative to a second body portion. The article of clothing can be a sports bra that controls the wearer's breast movement relative to the wearer's torso. As the breast moves, the piezoelectric transducer deforms and induces a voltage that is passed to the electrical component. The electrical component provides either a resistance or a control signal to the transducer. The transducer stiffens in response to the electrical component and reduces the movement of the breast by placing an external force on the breast.

11 Claims, 2 Drawing Sheets

PIEZOELECTRICALLY CONTROLLED ACTIVE WEAR

FIELD OF THE INVENTION

The present invention relates to active wear that overlies two relatively moveable portions of a human body.

BACKGROUND OF THE INVENTION

Active wear, such as a sports bra, is generally worn as protective wear for temperature regulation, force control or motion restraint. Motion restraint can be implemented, for example, by increasing the stiffness of the material extending across a body joint or by compressing a body part on one side of a body joint.

SUMMARY OF THE INVENTION

In accordance with a principal feature of the invention, an apparatus comprises an article of clothing and a piezoelectric transducer. The article of clothing is configured to overlie first and second relatively moveable portions of a human body so as to move in conformance with the relatively moveable body portions. The piezoelectric transducer is coupled to the article of clothing so as to undergo a deflection in response to the relative body movement. The relative body movement thus results in a kinetic energy. The transducer generates a voltage signal proportional to the magnitude of the deflection. An electrical component applies a resistance to the voltage signal. When this resistance is applied to the voltage signal of the transducer, the transducer dissipates the kinetic energy of the relative body movement and restrains the relative movement of the portions of the human body.

In accordance with another principal feature of the invention, the apparatus can include both sensing and actuating transducers. The sensing transducer generates a voltage signal proportional to the deflection induced by the relative movement of the body portions. The actuating transducer receives a control signal from the electrical component and stiffens the actuating transducer to damp the relative movement.

DESCRIPTION OF A PREFERRED EMBODIMENT

Figure 1:
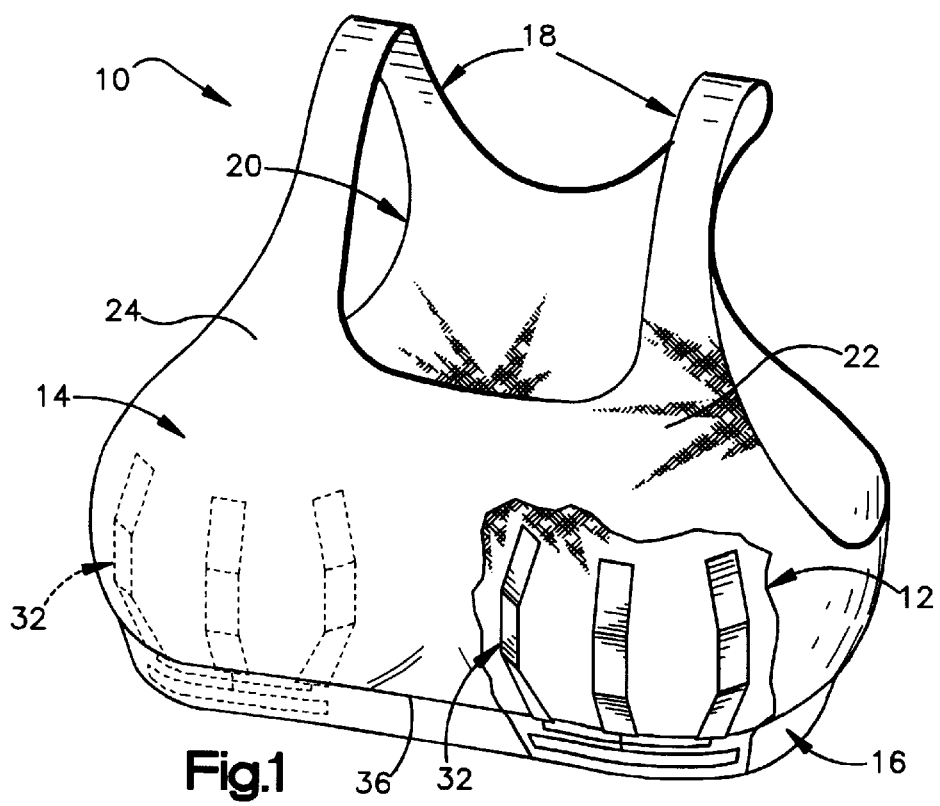
FIG. 1 is an orthogonal view of an apparatus comprising a preferred embodiment of the present invention.

A sports bra 10 comprising a preferred embodiment of the present invention is shown schematically in FIG. 1. The sports bra 10 includes left and right cups 12 and 14, a base band 16, shoulder straps 18 and a one-piece back 20. The shoulder straps 18 extend from the tops 22 and 24 of the left and right cups 12 and 14 and the one-piece back 20. The base band 16 is a generally circular piece of a stretchable material that couples the lower edge 36 of the cups 12 and 14 in the front with the one-piece back 20 in the rear. In accordance with the invention, left and right piezoelectric control systems 32 are mounted on the bra 10.

Figure 2:
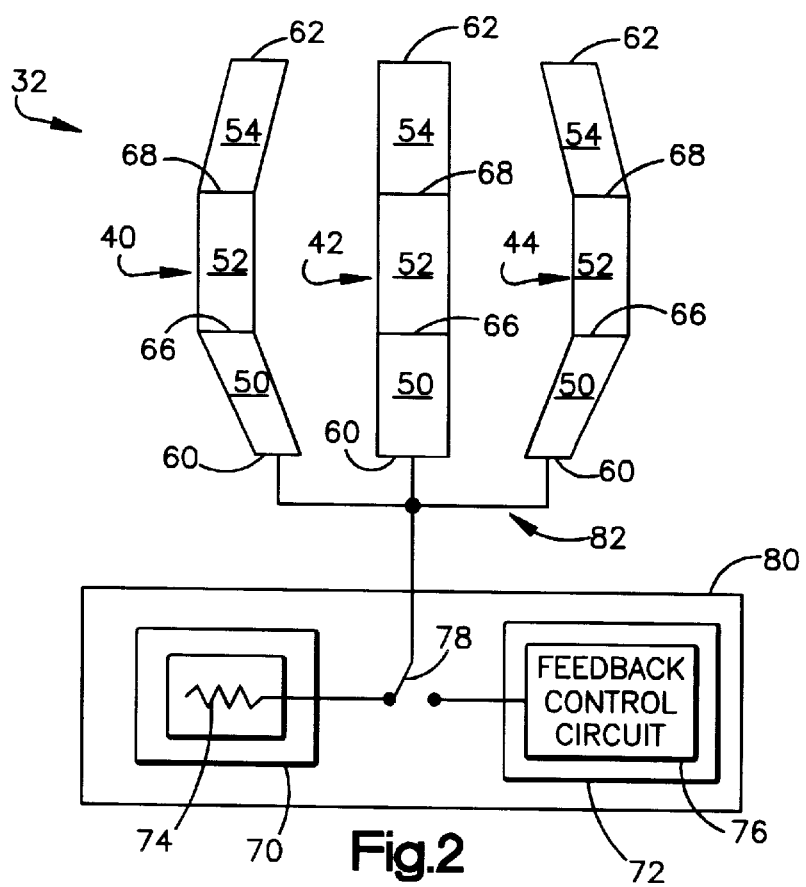
FIG. 2 is a view of parts of parts of the apparatus shown in FIG. 1.

The piezoelectric control systems 32 are alike and each has the configuration shown in FIG. 2. Each control system 32 thus includes three piezoelectric strips 40, 42, and 44. Each strip 40,42, and 44 is similar in that it has three distinct regions: lower 50, middle 52, and upper 54. The lower region 50 has a lower end 60. The upper region 54 has an upper end 62. A lower fold line 66 is formed where the lower and middle regions 50 and 52 meet. An upper fold line 68 is formed where the middle and upper regions 52 and 54 meet.

The inside strip 42 is configured to follow the contour of the front of a breast. The lower region 50 of the inside strip 42 projects forward from its lower end 60. The middle region 52 projects upward from the lower fold line 66, and the upper region 54 projects backward from the upper fold line 68.

The outside strips 40 and 44 are similarly configured to follow the contour of opposite sides of the breast. The lower regions 50 of the outside strips 40 and 44 project laterally outward and forward from their lower ends 60. The middle regions 52 of the outside strips 40 and 44 project upward from the lower fold lines 66, and the upper regions 54 project oppositely relative to the lower regions 50. The piezoelectric strips 40,42, and 44 are thus configured to function as transducers in the control systems 32.

Each control system 32 further includes a pair of electrical components 70 and 72, as shown schematically in FIG. 2. The first electrical component 70 includes a resistive element 74. The second electrical component 72 includes a feedback control circuit 76. A switch 78, also schematically shown in FIG. 2, allows the wearer to choose between the first and second electrical components 70 and 72. An electrical package 80 contains the switch 78 and the electrical components 70 and 72. Electrical wiring 82 connects the piezoelectric strips 40, 42, and 44 to the electrical package 80.

When the switch 78 is shifted to the first electrical component 70, the control system 32 operates in a first mode. Alternatively, when the switch 78 is shifted to the second electrical component 72, the control system 32 operates in a second mode. The wearer can thus select the mode of operation by shifting the switch 78 to the desired position.

The control systems 32 can be mounted on the sports bra 10 in any manner consistent with the intended operation of the piezoelectric strips 40, 42, and 44. In the preferred embodiment, the lower ends 60 of the piezoelectric strips 40, 42, and 44 are attached to the base band 16. The piezoelectric strips 40, 42, and 44 are located between adjacent fabric layers of the corresponding cup 12 or 14. The electrical package 80 also is mounted on the base band 16.

Each of the piezoelectric strips 40,42, and 44 responds to a deflection by the direct effect of the piezoelectric material. When the breast moves relative to the torso, the distinct regions 50, 52 and 54 of the strips 40,42, and 44 deflect relative to the lower ends 60. A voltage is generated in each of the piezoelectric strips 40, 42, and 44 and is proportional to the deflection caused by the breast movement.

If the wearer selects the first mode of operation by positioning the switch 78 appropriately, the first electrical component 70 is placed in electrical contact with the electrical wiring 82 and the strips 40,42, and 44. The first mode uses the resistive element 74 to dissipate the energy stored within each strip 40, 42, or 44 when the strip 40, 42, or 44 is deformed. In the preferred embodiment, the resistive element 74 is a resistor that dissipates energy by an ohmic heating process. Accordingly the kinetic energy of the movement of the strips 40, 42, and 44 is changed into heat produced through the resistor 74. The strips 40, 42, and 44 are thus stiffened by the resistance of the resistor 74. The stiffened strips 40, 42, and 44 then apply forces to restrain movement of the breast relative to the wearer's torso. The resistance of the resistor 74, and hence the damping effect the transducers 40, 42, and 44 will have on the movement of the breast, is specified with respect to the physical characteristics of the particular piezoelectric material of which the strips 40, 42, and 44 are formed. Thus, the electronic filtering properties of the resistor and the strips 40, 42, and 44 damp movements within a range of specified physiologically appropriate frequencies. In accordance with a particular feature of the invention, the resistor 74 can further act as an ohmic heating element to convert a kinetic energy into thermal energy for warming the wearer.

If the wearer selects the second mode of operation by shifting the switch 78 appropriately, the second electrical component 72 is placed in electrical contact with the wiring 82 and the strips 40, 42, and 44. The second electrical component 72 uses the control circuit 76 shown in the feedback control loop of FIG. 3. In this control circuit 76 the inner piezoelectric strip 42 is used as a sensing strip and the outer piezoelectric strips 40 and 44 are used as actuating strips. A deflection of the sensing strip 42 is used to stiffen and deflect the actuating strips 40 and 44. The feedback matches the force due to the acceleration of the breast with a restraining force in the actuating strips 44 and 46. The restraining force corresponds to the voltage from the sensing strip 42.

More specifically, a force F is applied to a breast due to the effects of exercise on the breast as the breast is coupled to the torso. Breast dynamics 82 determine the acceleration of the breast $a_B$. Breast kinematics 84 transform the breast acceleration $a_B$ into a breast displacement $x_B$. The bra coupling 86 to the breast displacement $x_B$ results in a bra displacement $x_{BR}$ which deflects the sensing strip 42. A sensed voltage $V_c$ is then induced across the sensing strip 42 by the direct piezoelectric effect, and the magnitude of the sensed voltage $V_c$ is proportional to the amount of deflection. This magnitude is defined in the piezoelectric sensor transfer function 90.

The sensed voltage $V_c$ is then used as the input to the feedback control circuit transfer function 76. The feedback control circuit transfer function 76 is tuned to create a feedback force $F_{FB}$ on the breast to damp the breast acceleration $a_B$ and to minimize the breast displacement $x_B$. The magnitude of the feedback force $F_{FB}$ is determined by the interaction of different physical characteristics of the actuating strips 40 and 44, and the coupling of the actuating strips 40 and 44 to the breast. In the preferred embodiment these physical characteristics are modeled in the feedback control circuit 92 to properly generate the feedback force $F_{FB}$. These physical characteristics can be modeled by the piezoelectric actuator control function 98, the bra movement function 100, and the breast reaction function 102.

The feedback control circuit 92 sends a feedback voltage $V_{FB}$ to the actuating piezoelectric strips 44 and 46. The actuator displacement $x_{PE}$ is the response of the piezoelectric actuator transfer function 98 to the feedback voltage $V_{FB}$ due to the indirect piezoelectric effect of the piezoelectric material. The feedback bra displacement $x_{FB}$ occurs from the actuator displacement $xP_E$ as defined by the bra movement transfer function 100. The feedback force $F_{FB}$ is the breast reaction 102 to the feedback bra displacement $x_{FB}$. The feedback force $F_{FB}$ matches the magnitude of the force on the breast due to exercise F, but is applied in the opposite direction of the force on the breast due to exercise F. As a result, the sum of the force on the breast due to exercise F and the feedback force $F_{FB}$ is small and results in restrained relative movement between the breast and the torso.

Although the preferred embodiment includes the switch 78, an alternative embodiment could be configured without the switch 78. Such an embodiment would include an article of clothing in which the control system 32 directly connects to only the first electrical component 70 so that the embodiment operates only in the first mode. This embodiment could be used, for example, in an application where the user requires heat for a body part but does not require movement control of relatively movable body portions. Yet another alternative embodiment can be configured to connect the control system 32 directly to only the second electrical component 72. Such an embodiment would operate only in the second mode. This alternative embodiment would control the movement of relatively movable body portions but would not be used to convert kinetic energy into heat.

The invention has been described with reference to a preferred embodiment. Those skilled in the art will perceive improvements, changes and modifications. Such improvements, changes and modifications are intended to be within the scope of the claims.

The following is claimed:

1. Apparatus comprising:
    an article of clothing configured to overlie first and second relatively moveable portions of a human body so as to move in conformance with relative movement of said first and second relatively moveable body portions;
    a piezoelectric transducer coupled to said article of clothing so as to undergo a deflection in response to said relative movement of said body portions and to generate a voltage signal proportional to the magnitude of said deflection; and
    an electrical component configured to apply a resistance to said voltage signal such that said transducer, having said resistance applied to said voltage signal, dissipates the kinetic energy of said relative movement and thus restrains said relative body movement of said body portions.

2. Apparatus as defined in claim 1 wherein said electrical component comprises an ohmic heating element.

3. Apparatus as defined in claim 1 wherein said article of clothing is a sports bra comprising a base band, two breast cups and shoulder straps, and said transducer is coupled to said sports bra so as to undergo said deflection in response to movement of one of said breast cups relative to said base band.

4. Apparatus as defined in claim 1 wherein said electrical component is configured so that said piezoelectric transducer damps movements that are in a specified physiologically appropriate frequency range.

5. Apparatus comprising:
    an article of clothing configured to overlie first and second relatively moveable portions of a human body so as to move in conformance with relative movement of said body portions;
    a piezoelectric sensing transducer coupled to said article of clothing so as to undergo a deflection in response to said relative movement of said body portions and to generate a voltage signal proportional to the magnitude of said deflection;
    a piezoelectric actuating transducer coupled to said article of clothing; and
    an electrical component configured to sense said voltage signal from said piezoelectric sensing transducer and to respond by actuating said piezoelectric actuating transducer to stiffen said article of clothing and thereby to restrain said relative movement of said body portions.

6. Apparatus as defined in claim 5 wherein said article of clothing is a sports bra comprising a base band, two breast cups and shoulder straps, and said transducer is coupled to said sports bra so as to undergo said deflection in response to movement of one of said breast cups relative to said base band.

7. Apparatus comprising:

an article of clothing configured to overlie first and second relatively moveable portions of a human body so as to move in conformance with relative movement of said body portions;

a piezoelectric sensing transducer coupled to said article of clothing so as to undergo a deflection in response to said relative movement of said body portions and to generate a voltage signal proportional to the magnitude of said deflection;

a piezoelectric actuating transducer coupled to said article of clothing;

a first electrical component configured to apply a resistance to said voltage signal such that said transducer, having said resistance applied to said voltage signal, dissipates the kinetic energy of said relative movement and thus restrains said relative movement of said body portions;

a second electrical component configured to sense said voltage signal from said piezoelectric sensing transducer and to respond by actuating said piezoelectric actuating transducer to stiffen said article of clothing and thereby to restrain said relative movement of said body portions; and a switch operative to couple said transducers with either said first electrical component or said second electrical component.

8. Apparatus as defined in claim 7 wherein said first electrical component comprises an ohmic heating element.

9. Apparatus as defined in claim 7 wherein said article of clothing is a sports bra comprising a base band, two breast cups and shoulder straps, and said transducer is coupled to said sports bra so as to undergo said deflection in response to movement of one of said breast cups relative to said base band.

10. Apparatus comprising:

an article of clothing configured to overlie first and second relatively moveable portions of a human body so as to move in conformance with relative movement of said first and second relatively moveable body portions;

a piezoelectric transducer coupled to said article of clothing so as to undergo a deflection in response to said relative movement of said body portions and to generate a voltage signal proportional to the magnitude of said deflection; and an ohmic heating element operative to apply a resistance to said voltage signal so that said ohmic heating element generates thermal energy that warms said article of clothing.

11. Apparatus as defined in claim 10 wherein said article of clothing is a sports bra comprising a base band, two breast cups and shoulder straps, and said transducer is coupled to said sports bra so as to undergo said deflection in response to movement of one of said breast cups relative to said base band.

* * * * *

UNITED STATES PATENT AND TRADEMARK OFFICE
CERTIFICATE OF CORRECTION

Figure 3:
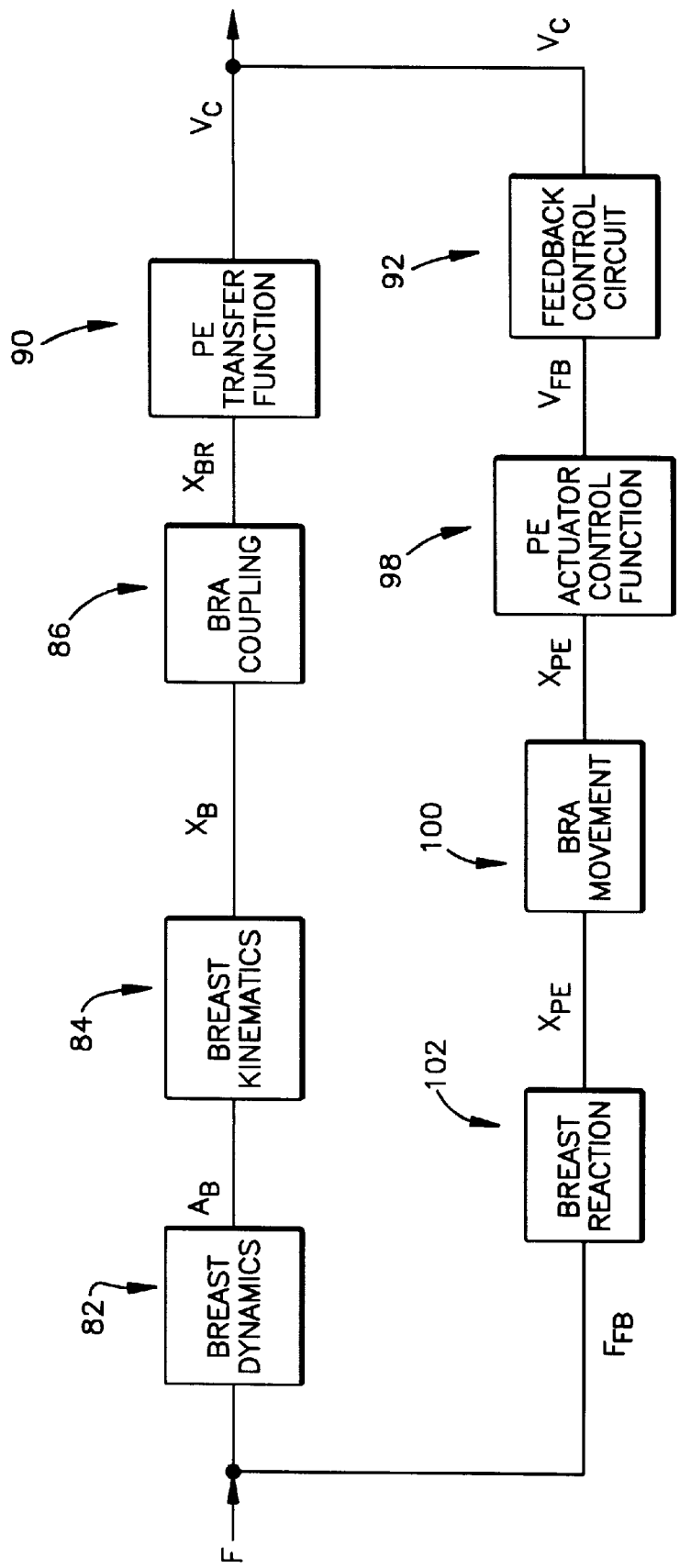
FIG. 3 is a block diagram of a feedback control system constructed in accordance with a principal feature of the invention.

PATENT NO. : 6,198,204 B1
DATED : March 6, 2001
INVENTOR(S) : Michael D. Pottenger It is certified that error appears in the above-identified patent and that said Letters Patent is hereby corrected as shown below:

Drawings,
Sheet 2, Fig. 3, the term "$X_{PE}$" appearing between the block labeled with reference numberal 100 and block labeled with reference numeral 102 should read -- $X_{FB}$ --.

Column 1,
Line 46, cancel the first instance of the phrase "of parts".

Column 3,
Line 27, the numerals "44 and 46" should read -- 40 and 44 --.
Line 62, the term "$xP_E$" should read -- $x_{PE}$ --.

Signed and Sealed this

Fourteenth Day of January, 2003

JAMES E. ROGAN
*Director of the United States Patent and Trademark Office*